(12) United States Patent
Alam et al.

(10) Patent No.: US 9,740,431 B2
(45) Date of Patent: *Aug. 22, 2017

(54) MEMORY CONTROLLER AND METHOD FOR INTERLEAVING DRAM AND MRAM ACCESSES

(71) Applicant: Everspin Technologies, Inc., Chandler, AZ (US)

(72) Inventors: Syed M. Alam, Austin, TX (US); Thomas Andre, Austin, TX (US); Dietmar Gogl, Austin, TX (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/212,271

(22) Filed: Jul. 17, 2016

(65) Prior Publication Data

US 2016/0350031 A1 Dec. 1, 2016

Related U.S. Application Data

(62) Division of application No. 14/827,628, filed on Aug. 17, 2015, now Pat. No. 9,418,001, which is a division
(Continued)

(51) Int. Cl.
*G11C 11/00* (2006.01)
*G06F 3/06* (2006.01)
(Continued)

(52) U.S. Cl.
CPC .......... *G06F 3/0659* (2013.01); *G06F 3/0611* (2013.01); *G06F 3/0685* (2013.01);
(Continued)

(58) Field of Classification Search
CPC .... G06F 3/0659; G06F 3/0611; G06F 3/0685; G06F 13/1694; G06F 12/0246;
(Continued)

(56) References Cited

U.S. PATENT DOCUMENTS 5,301,278 A 4/1994 Bowater et al.
7,206,956 B2 4/2007 Johnson et al.
(Continued)

OTHER PUBLICATIONS

International Search Report mailed Apr. 25, 2012, in PCT/US2011/065571.
(Continued)

*Primary Examiner* — Tha-O H Bui
(74) *Attorney, Agent, or Firm* — Bookoff McAndrews, PLLC

(57) ABSTRACT

A memory system and memory controller for interleaving volatile and non-volatile memory accesses are described. In the memory system, the memory controller is coupled to the volatile and non-volatile memories using a shared address bus. Activate latencies for the volatile and non-volatile memories are different, and registers are included on the memory controller for storing latency values. Additional registers on the memory controller store precharge latencies for the memories as well as page size for the non-volatile memory. A memory access sequencer on the memory controller asserts appropriate chip select signals to the memories to initiate operations therein.

20 Claims, 6 Drawing Sheets

Related U.S. Application Data of application No. 13/328,867, filed on Dec. 16, 2011, now Pat. No. 9,135,965.

(60) Provisional application No. 61/424,355, filed on Dec. 17, 2010.

(51) Int. Cl.

| | | |
|---|---|---|
| *G11C 7/10* | (2006.01) | |
| *G11C 11/4076* | (2006.01) | |
| *G11C 8/04* | (2006.01) | |
| *G06F 12/02* | (2006.01) | |
| *G06F 12/06* | (2006.01) | |
| *G11C 11/16* | (2006.01) | |
| *G11C 11/4094* | (2006.01) | |
| *G11C 11/4096* | (2006.01) | |
| *G11C 14/00* | (2006.01) | |
| *G06F 13/16* | (2006.01) | |
| *G11C 11/4091* | (2006.01) | |

(52) U.S. Cl.
CPC ...... *G06F 12/0246* (2013.01); *G06F 12/0638* (2013.01); *G06F 13/1694* (2013.01); *G11C 7/1042* (2013.01); *G11C 7/1072* (2013.01); *G11C 8/04* (2013.01); *G11C 11/005* (2013.01); *G11C 11/1673* (2013.01); *G11C 11/1675* (2013.01); *G11C 11/4076* (2013.01); *G11C 11/4091* (2013.01); *G11C 11/4094* (2013.01); *G11C 11/4096* (2013.01); *G11C 14/0036* (2013.01); *G06F 2212/205* (2013.01); *G06F 2212/7201* (2013.01); *G11C 11/16* (2013.01)

(58) Field of Classification Search
CPC ............ G11C 11/4091; G11C 11/1675; G11C 11/1673; G11C 11/4096; G11C 11/4094; G11C 12/0638; G11C 14/0036; G11C 7/1072; G11C 11/00
USPC ........................................................ 365/158
See application file for complete search history.

(56) References Cited

U.S. PATENT DOCUMENTS

| | | |
|---|---|---|
| 7,593,263 B2 | 9/2009 | Sokolov et al. |
| 7,764,539 B2 | 7/2010 | Guo et al. |
| 9,135,965 B2 | 9/2015 | Alam et al. |
| 9,418,001 B2* | 8/2016 | Alam .................. G11C 7/1042 |
| 2006/0230250 A1 | 10/2006 | Klint et al. |
| 2008/0126824 A1 | 5/2008 | Lee et al. |
| 2008/0140910 A1 | 6/2008 | Flynn et al. |
| 2008/0162768 A1 | 7/2008 | Klint et al. |
| 2008/0279032 A1 | 11/2008 | Kasamsetty et al. |
| 2008/0291727 A1* | 11/2008 | Seo .................... G06F 13/4234 |
| | | 365/185.08 |
| 2009/0231918 A1 | 9/2009 | Doyle |
| 2010/0110748 A1 | 5/2010 | Best |
| 2010/0274953 A1 | 10/2010 | Lee et al. |
| 2011/0051503 A1 | 3/2011 | Hu et al. |
| 2011/0087846 A1 | 4/2011 | Wang et al. |
| 2012/0004011 A1 | 1/2012 | Chun |
| 2012/0155160 A1 | 6/2012 | Alam et al. |

OTHER PUBLICATIONS

The International Bureau of WIPO, International Preliminary Report on Patentability in PCT International Application No. PCT/US2011/065571, mailed Jun. 27, 2013.
"Performance Optimization Algorithm for DDR Interface," Ostropolski et al., ISSC 2008, Galway, Jun. 18-19, pp. 1-4.
"DDR 3 SDRAM Memory Controller IP Core from Hi Tech Global," http://www.hitechglobal.com/IPCores/DDR3Controller.htm.
"DDR 2 Memory Controller IP Core for FPGA and SIC," http://www.hitechglobal.com/IPCores/DDR2Controller.htm.
"DDR Memory Controller IP from Denali," http://www.denali.com/en/products/databahn_dram.jsp.
"Intel Dual-Channel DDR Memory Architecture," http://www.kingston.com/newtech/mkf_520ddrwhitepaper.pdf.
European Search Report in Application No. 11847949.2-1953/2652741 PCT/US2011065571 dated Jun. 7, 2016.

* cited by examiner

MEMORY CONTROLLER AND METHOD FOR INTERLEAVING DRAM AND MRAM ACCESSES

CROSS REFERENCE TO RELATED APPLICATIONS

This application is a divisional of U.S. patent application Ser. No. 14/827,628, filed Aug. 17, 2015, which issued as U.S. Pat. No. 9,418,001 B2 on Aug. 16, 2016. U.S. patent application Ser. No. 14/827,628 is a divisional of U.S. patent application Ser. No. 13/328,867, filed Dec. 16, 2011, which issued as U.S. Pat. No. 9,135,965 on Sep. 15, 2015. This application and U.S. patent application Ser. Nos. 14/827,628 and 13/328,867 claim priority to and the benefit of U.S. Provisional Application No. 61/424,355, filed Dec. 17, 2010.

TECHNICAL FIELD

The exemplary embodiments described herein generally relate to a memory controller and more particularly to a memory system and method including a memory controller for interleaving synchronous dynamic random access memory (SDRAM) and spin-torque magnetic random access memory (ST-MRAM) having different latencies and page sizes.

BACKGROUND

A computer's speed is determined in large part by the speed of the processor and the ability to quickly move data between the processor and memory. The transfer of data from memory has increased with the use of multi-channels, or multiple paths, between the processor and memory.

Latency refers to delays in transmitting data between memory and a processor, and is usually measured in clock cycles. The processor is typically faster than the memory, so it must delay (wait) while the proper segment of memory is located and read before the data can be transmitted back to the processor. Data stored in memory is defined in banks. A rank is a plurality of banks in a first direction (column) and a channel is a plurality of banks in a second direction (row). A process for accessing the memory comprises several clock cycles required for row and column identification and a read or write command. SDRAM is synchronized with a system bus with a synchronous interface and therefore waits for a clock signal before responding to control inputs and is therefore synchronized with the computer's system bus.

A memory controller manages the flow of data going to and from the memory. It may be a separate chip or integrated into another chip, for example, a processor. The bandwidth for the data transfer may comprise a row of many thousands of bits. A double data rate (DDR) memory controller drives memory where data is transferred on the rising and falling access of the memory clock. This DDR memory controller allows for twice the data to be transferred without increasing the clock rate or increasing the bus width to the memory. DDR2 doubles the minimum read or write unit to four consecutive words. DDR3 doubles the minimum read or write unit, again, to eight consecutive words. This provides another doubling of bandwidth and external bus rate without having to change the clock rate of internal operations, just the width. The downside of this increased read or write unit is an increase in latency.

While memory controllers and methods are known of accessing SDRAM, and memory controllers and methods are known of accessing other types of memory, for example, ST-MRAM, none are known to describe a single memory controller accessing and interleaving both SDRAM and ST-MRAM. ST-MRAM utilizes an alternate method for programming a Magnetic Tunnel Junction (MTJ) element that has the potential to further simplify the MRAM cell and reduce write power. Unlike conventional MRAM where programming is performed with the aid of an external field, ST-MRAM programming is accomplished by driving current directly through the MTJ to change the direction of polarization of the free layer.

DDR3 ST-MRAM has longer ACTIVATE and PRECHARGE operation latencies than those of DDR3 DRAM. During the ACTIVATE operation, a page of data is read from the memory array and stored in local data-store latches for subsequent READ and WRITE operations to the local data-store latches. The ACTIVATE operation can be initiated by an ACTIVATE command or any other command that performs the same operation. During the PRECHARGE operation, the data from local data-store latches are written back to the memory array, and as a result, that page is considered closed or not accessible without a new ACTIVATE operation. The PRECHARGE operation can be initiated by a PRECHARGE or AUTO-PRECHARGE command or any other command that performs the same operation. In addition to ACTIVATE and PRECHARGE operation latencies, the page size of ST-MRAM is smaller (for example 512 bits) than that of DRAM (up to 16 k bits). Consequently, an open page in ST-MRAM has a fewer number of bits in the local data-store latches in ST-MRAM chip. The number of READ and WRITE operations (operations in response to READ or WRITE commands that read or write a smaller group of data bits, for example 128 bits, from or to the local data-store latch) to read or write the whole page following an ACTIVATE operation to ST-MRAM is smaller than that of the DRAM due to page size difference. When a system uses both DDR3 ST-MRAM and DRAM (due to high density of memory or non-volatility from ST-MRAM memory portion requirements), two or more memory controllers would be needed to manage different latencies and page size in ST-MRAM and DRAM. The DDR3 ST-MRAM would also need dedicated channels (more address, data, control pins and routing) associated with its own memory controller in addition to existing DDR3 DRAM channels.

Accordingly, it is desirable to provide a memory controller and method for interleaving at the rank or channel levels, and reducing latency thereof, a memory consisting of SDRAM and ST-MRAM. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

An apparatus and methods of interleaving volatile and non-volatile memory accesses are presented for separately programmed activate and precharge latencies, and page size for non-volatile memory.

A memory system includes a memory comprising a plurality of volatile memory banks comprising a first portion and a second portion; and at least one non-volatile memory bank comprising at least a third portion configured in one of rank or column with the first portion and the second portion; and a memory controller coupled to the volatile memory banks and the non-volatile memory banks and configured to synchronize the application of activate, read, write, and precharge operations to the first, second, and third portions.

A first exemplary method of interleaving volatile and non-volatile memory accesses including a plurality of volatile memory banks comprising a first portion and a second portion, and at least one non-volatile memory bank comprising at least a third portion configured in one of rank or column with the first portion and the second portion, the method comprising synchronizing the application of activate, read, write, and precharge operations to the first, second, and third portions.

A second exemplary method of interleaving volatile and non-volatile memory accesses comprises a) receiving an activate operation initiate command; b) determining if a rank address equals a non-volatile memory rank address; c) if step b) is no, initiating the activate operation in a volatile memory rank; d) resetting a volatile memory latency counter to A; e) if A is not equal to a volatile memory latency, incrementing A and repeating step e); f) if A is equal to the volatile memory latency, performing volatile memory read/write operations; g) initiating a volatile memory precharge operation; h) resetting a volatile memory precharge latency counter to B; i) if B is not equal to a volatile memory precharge latency, incrementing B and repeating step i) until B is equal to a volatile memory precharge latency; j) if step b) is yes, initiating the activate operation in a non-volatile memory rank; k) resetting a non-volatile memory activate latency counter to C; l) if C is not equal to the non-volatile memory latency, incrementing C and repeating step l); m) if C is equal to a non-volatile memory latency, performing non-volatile memory read/write operations; n) initiating a non-volatile memory precharge operation; o) resetting a non-volatile memory precharge latency counter D; and p) if D is not equal to the non-volatile memory precharge latency, incrementing D and repeating step p) until D is equal to the non-volatile memory precharge latency.

A third exemplary method of interleaving volatile and non-volatile memory accesses includes interleaving volatile and non-volatile memory accesses, comprising a) initiating activate operations in a volatile memory rank and a non-volatile memory rank; b) resetting a volatile memory activate latency counter to A; c) if A is not equal to a volatile memory activate latency, incrementing A and repeating step c); d) if A is equal to the volatile memory, performing volatile memory read/write operations; e) initiating a volatile memory precharge operation; f) resetting a volatile memory precharge latency counter to B; g) if B is not equal to a volatile memory precharge latency, incrementing B and repeating step g) until B is equal to a volatile memory precharge latency; h) subsequent to step a), resetting a non-volatile memory activate latency counter to C; i) if C is not equal to a non-volatile memory latency, incrementing C and repeating step i); j) if C is equal to the non-volatile memory latency, performing non-volatile memory read/write operations; k) initiating a non-volatile memory precharge operation; l) resetting a non-volatile memory precharge latency counter to D; and m) if D is not equal to a non-volatile memory precharge latency, incrementing D and repeating m) until D is equal to a non-volatile memory precharge latency.

A fourth exemplary method of interleaving volatile and non-volatile memory accesses includes a) initiating activate operations in a non-volatile memory and a volatile memory; b) setting a non-volatile memory activate latency counter to C; c) setting a non-volatile memory activated flag to NO; d) if C is not equal to a non-volatile memory activate latency, incrementing C and repeating step d); e) if C is equal to a non-volatile memory activate latency, setting a non-volatile memory activated flag to YES; f) subsequent to step a), setting a volatile memory activate latency counter to A; g) if A does not equal a volatile memory activate latency, incrementing A and repeating step g); h) if A equals a volatile memory activate latency, initiating read/write operations; i) if the non-volatile memory activated flag is NO, identifying the data bus portion of the volatile memory as valid and completing read/write operations for only the volatile memory j) if the non-volatile memory activated flag is YES, identifying data bus portions of the non-volatile memory and the volatile memory as valid and completing read/write operations of both the volatile and non-volatile memory; k) if there is more read/write operations pending, initiate read/write operations and repeat from step i) l) if there are no more read/write operations pending, initiating precharge operations in a non-volatile memory and a volatile memory; m) resetting a volatile memory precharge latency counter to B; n) if B is not equal to a volatile memory precharge latency, incrementing B and repeating step n) until B is equal to a volatile memory precharge latency. o) subsequent to step l), resetting a non-volatile memory precharge latency counter to D; p) if D is not equal to a non-volatile precharge latency, incrementing D and repeating step p) until D is equal to non-volatile precharge latency.

BRIEF DESCRIPTION OF THE DRAWINGS

The present invention will hereinafter be described in conjunction with the following drawing figures, wherein like numerals denote like elements.

DETAILED DESCRIPTION

Figure 1:
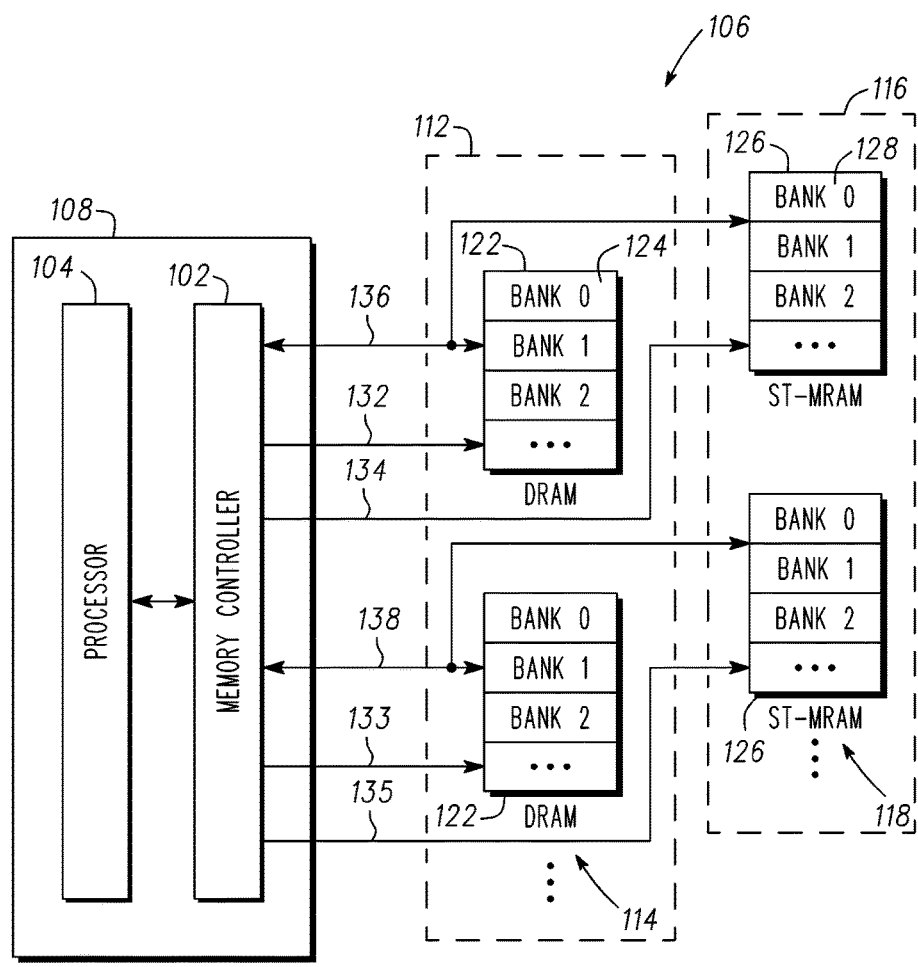
FIG. 1 is a block diagram of a memory controller between a processor and memory in accordance with a first exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

A memory interconnection system and method are described where a single DDR3 memory controller in a host chip or stand alone chip communicates with a number of memory modules comprising of at least one spin torque magnetic random access memory (ST-MRAM) integrated in a different Rank or Channel with dynamic random access memory (DRAM). While the exemplary embodiments are described in terms of DRAM and ST-MRAM, the embodiments would include a memory system having any different types of memory with different latencies and page sizes, for example, volatile and non-volatile memory.

According to a first embodiment, ST-MRAM is rank interleaved with DRAM where a rank of ST-MRAM chip(s) shares the address and data bus with those from another rank of DRAM chip(s). Separate chip select (CS) lines are provided for each rank. An ACTIVATE operation for an address can be initiated in both DRAM and ST-MRAM simultaneously with CS for both ranks high. The ACTIVATE operation in the DRAM rank would complete earlier than that in ST-MRAM rank. Hence, the memory controller initiates READ or WRITE operations only in the DRAM rank by asserting proper CS signals as soon as the DRAM ACTIVATE operation is complete. An ACTIVATE operation in the ST-MRAM rank can be ongoing during this time. READ or WRITE operations to the ST-MRAM rank are initiated later when the ST-MRAM's ACTIVATE operation is complete. This enables seamless DRAM access without slowing due to longer latency ST-MRAM. The DDR3 Memory Controller includes programmable registers for ACTIVATE and PRECHARGE latencies and for page size of the ST-MRAM. The memory controller further includes a programmable register for rank address of the ST-MRAM. These registers can be programmed through software during runtime. When the DDR3 memory controller receives a memory access command from the host chip, it compares the rank address portion of the memory address with the ST-MRAM programmable rank address register. If the rank address indicates ST-MRAM memory access, the controller retrieves ACTIVATE, PRECHARGE latencies, and page size from the programmable registers. The hardware implementation of the controller would also contain separate ACTIVATE and PRECHARGE time-out counters for ST-MRAM than DRAM to indicate when corresponding memory ACTIVATE and PRECHARGE are complete.

According to a second and third embodiment of the memory interconnection system, the ST-MRAM data channel is interleaved with DRAM where only a portion of the data bus is connected to the ST-MRAM while the remaining portion is connected to the DRAM. The address bus is shared with both ST-MRAM and DRAM. A CS control signal can be shared for the second embodiment or separated for the third embodiment. An ACTIVATE operation for an address can be initiated in both DRAM and ST-MRAM simultaneously with CS high for both the second and third embodiments. The ACTIVATE operation in DRAM would complete earlier than that in ST-MRAM. Subsequently, the memory controller initiates READ or WRITE operations in both DRAM and ST-MRAM in case of shared CS signal. The portion of the data bus connected to DRAM will provide correct read data while the portion of the data bus connected to ST-MRAM will not provide correct read data as the ACTIVATE operation in ST-MRAM is not yet complete. The memory controller will ignore the portion of the data from ST-MRAM and only use the data bus of DRAM for valid data. The portion of the data from ST-MRAM is read later after the ST-MRAM ACTIVATE operation is complete.

The DDR3 Memory Controller includes programmable registers for ACTIVATE and PRECHARGE latencies and for page size of the ST-MRAM. The memory controller further includes programmable register for data channel address of the ST-MRAM. These registers can be programmed through software during runtime. When the DDR3 memory controller receives a memory access command from the host chip, it retrieves ACTIVATE, PRECHARGE latencies and page size from the aforementioned programmable registers for the data channels where ST-MRAM is connected. The remainder of the data channels follows DRAM latencies and page size. The hardware implementation of the controller would also contain separate ACTIVATE and PRECHARGE time-out counters for ST-MRAM than DRAM to indicate when corresponding memory ACTIVATE and PRECHARGE are complete.

The DDR3 Memory Controller, for any of the embodiments of the memory interconnection system described herein, further contains a queue for queuing memory commands from the host chip. Memory commands can be categorized into DRAM and ST-MRAM memory accesses due to their unique rank or channel address. Methods of operation for the memory controller include the following operation queuing and initiating algorithms: (a) ST-MRAM ACTIVATE operations can be initiated earlier than DRAM ACTIVATE operations from a queue of ACTIVATE operations. (b) An ST-MRAM ACTIVATE operation busy flag (provided by the time-out counter) in the Controller queues ST-MRAM read/write operations, while DRAM memory access operations can be initiated. (c) More READ/WRITE operations in the ST-MRAM are queued up prior to initiating a PRECHARGE operation in the ST-MRAM to close an open row. Due to longer ACTIVATE and PRECHARGE operation latencies in ST-MRAM, the queuing algorithm waits and queues a higher (than that of DRAM) number of READ/WRITE operations to ensure there are no pending READ/WRITE operation for an already open ST-MRAM row prior to closing the open row; therefore, ST-MRAM PRECHARGE operation is less frequent than DRAM PRECHARGE operation. (d) In a sequence of ST-MRAM and DRAM PRECHARGE operations, the ST-MRAM PRECHARGE operation can be initiated earlier to hide the longer latency; (e) when full page accesses are requested from ST-MRAM and DRAM, ST-MRAM memory READ/WRITE operations for an open page is performed different number of times due to page size difference from DRAM.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, resistive, or organic properties corresponding to the data bits. It should be appreciated that the various clock components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques related to data processing, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

FIG. 1 is a block diagram of a first exemplary embodiment of a memory system 100 including a memory controller 102 that interleaves data transfer between a processor 104 and the memory 106. The memory controller 102 and the processor 104 may reside on the same chip 108, or they may reside on separate chips (not shown). The memory 106 comprises a first rank 112 of volatile memory 114, preferably DRAM, and a second rank 116 of non-volatile memory 118 using magnetic tunnel junctions for data storage, preferably ST-MRAM. The volatile memory 114 comprises a plurality of volatile memory elements 122, each including a plurality of volatile memory banks 124. The non-volatile memory 118 comprises at least one non-volatile memory element 126, each including a plurality of non-volatile memory banks 128.

First and second CS lines 132, 133 provide first and second CS signals, respectively, from the memory controller 102 to each of the volatile memory elements 122 and first and second CS lines 134, 135 provide first and second CS signals, respectively, from the memory controller 102 to each of the non-volatile memory elements 126. In another embodiment (not shown), first and second CS lines 132, 133 can be the same single CS line from the memory controller 102 to each of the volatile memory elements 122, and first and second CS lines 134, 135 can be the same single CS line from the memory controller 102 to each of the non-volatile memory elements 126. A first address/data bus 136 couples the memory controller 102 to one of the volatile memory elements 122 and one of the non-volatile memory elements 126. Likewise, a second address/data bus 138 couples the memory controller 102 to one of the volatile memory elements 122 and one of the non-volatile memory elements 126. Though only two address/data buses 136, 138 are shown, it should be understood that one each of a plurality of address/data buses couple each of a pair of the volatile and non-volatile memory elements 122, 126.

Non-volatile memory 118 is rank interleaved with volatile memory 114 where a rank of non-volatile memory chip(s) shares the address and data bus with those from another rank of volatile memory chip(s). Separate CS lines 132, 134 are provided for each rank. An ACTIVATE operation for an address can be initiated in both volatile memory 114 and non-volatile memory 118 simultaneously with CS for both ranks high. The ACTIVATE operation in the volatile memory rank 112 would complete earlier than that in the non-volatile memory rank 116. Hence, the memory controller 102 initiates READ or WRITE operations only in the volatile memory rank 112 by asserting a proper CS signal as soon as the volatile memory ACTIVATE operation is complete. An ACTIVATE operation in the non-volatile memory rank 116 can be ongoing during this time. READ or WRITE operations in the non-volatile memory rank 116 are initiated later when the non-volatile memory's ACTIVATE operation is complete. This enables seamless volatile memory access without slowing down due to longer latency non-volatile memory.

Figure 2:
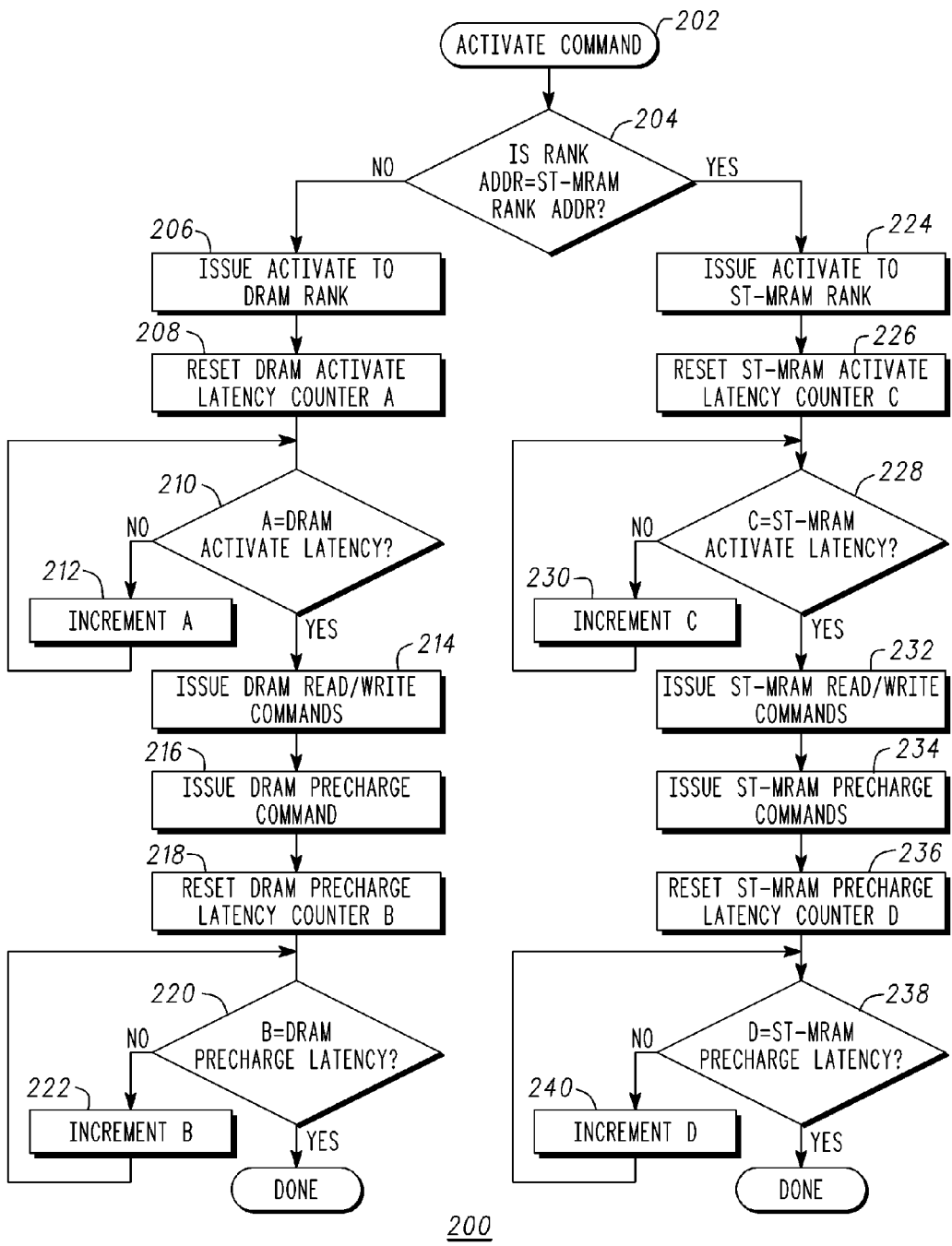
FIG. 2 is a flow chart of a first exemplary method for which the first exemplary embodiment is configured.
Figure 3:
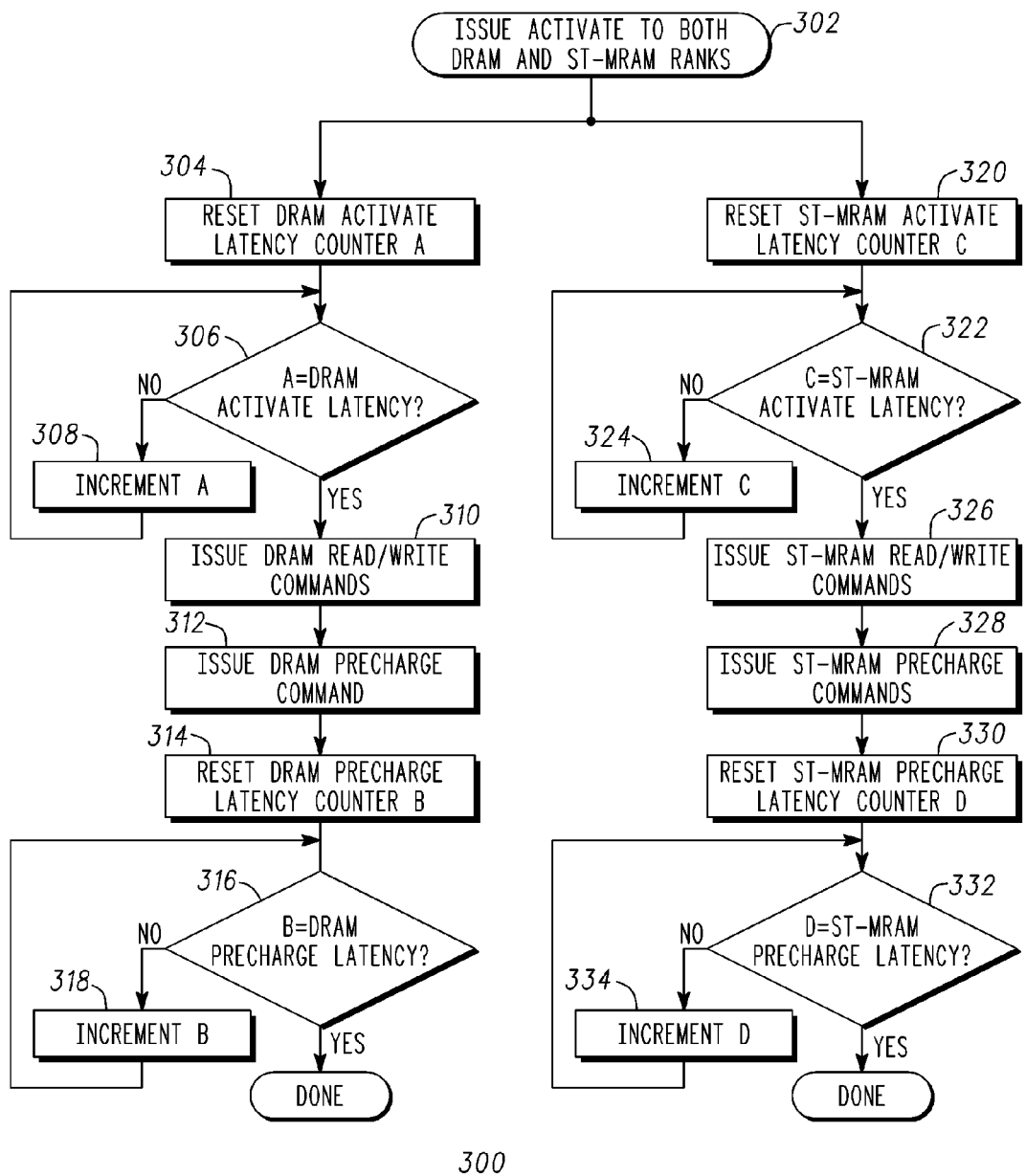
FIG. 3 is a flow chart of a second exemplary method for which the first exemplary embodiment is configured.
Figure 5:
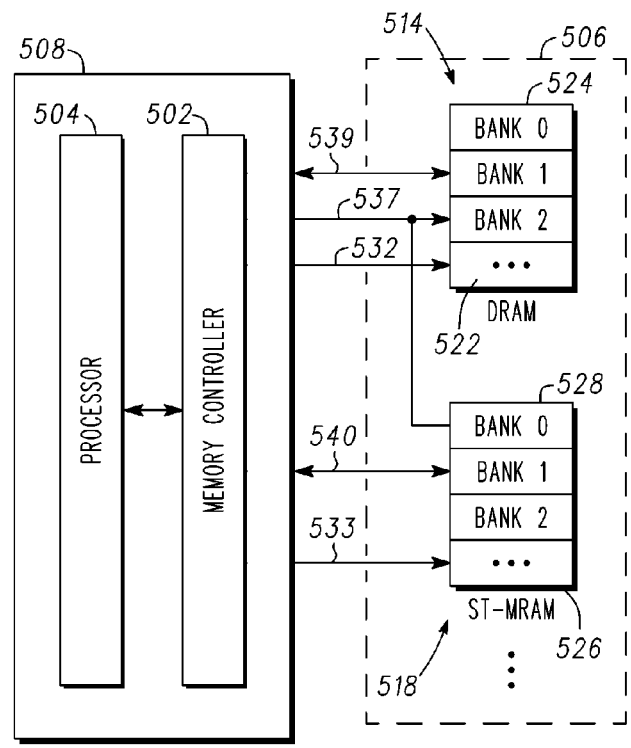
FIG. 5 is a block diagram of a memory controller between a processor and memory in accordance with a third exemplary embodiment.
Figure 6A:
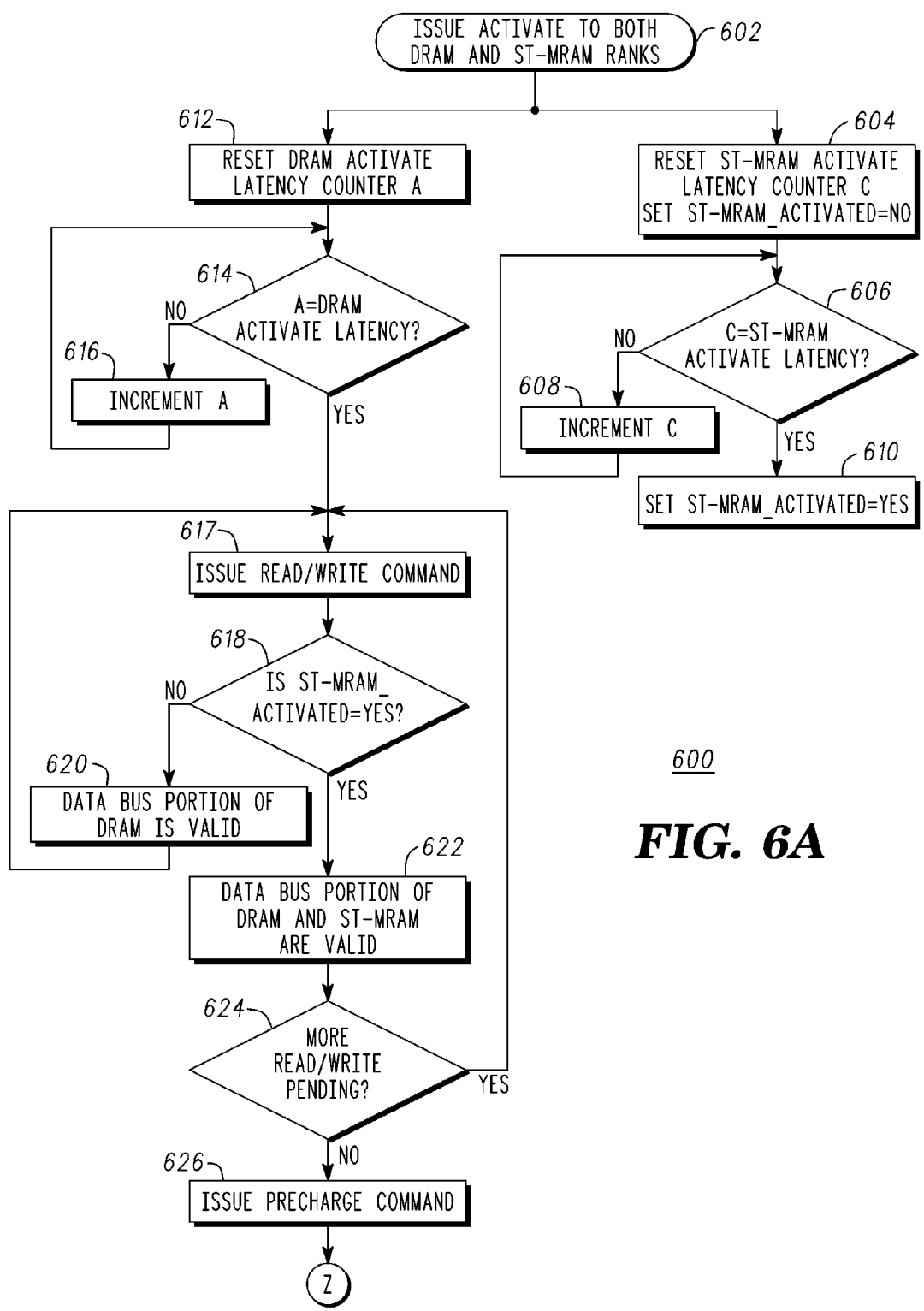
FIGS. 6A and 6B are a flow chart of a third exemplary method for which the second and third exemplary embodiments are configured.
Figure 6B:
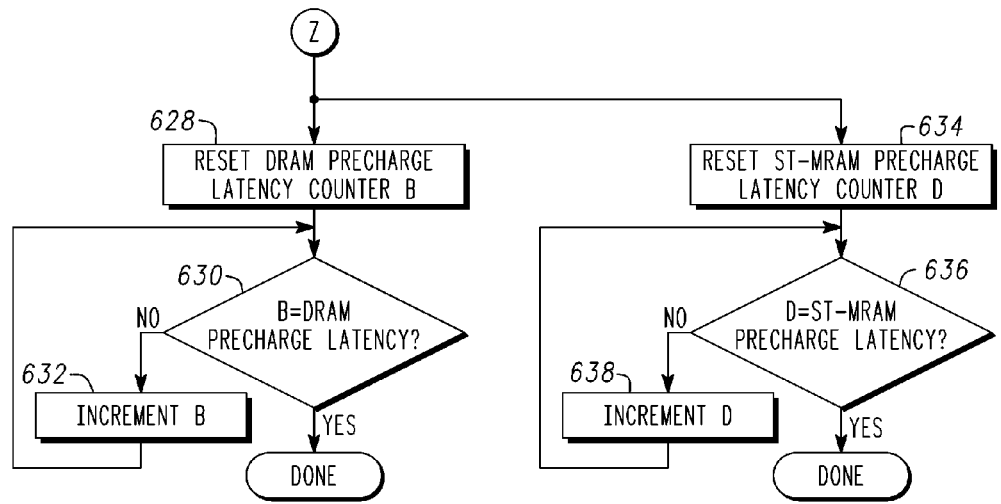
Figure 7:
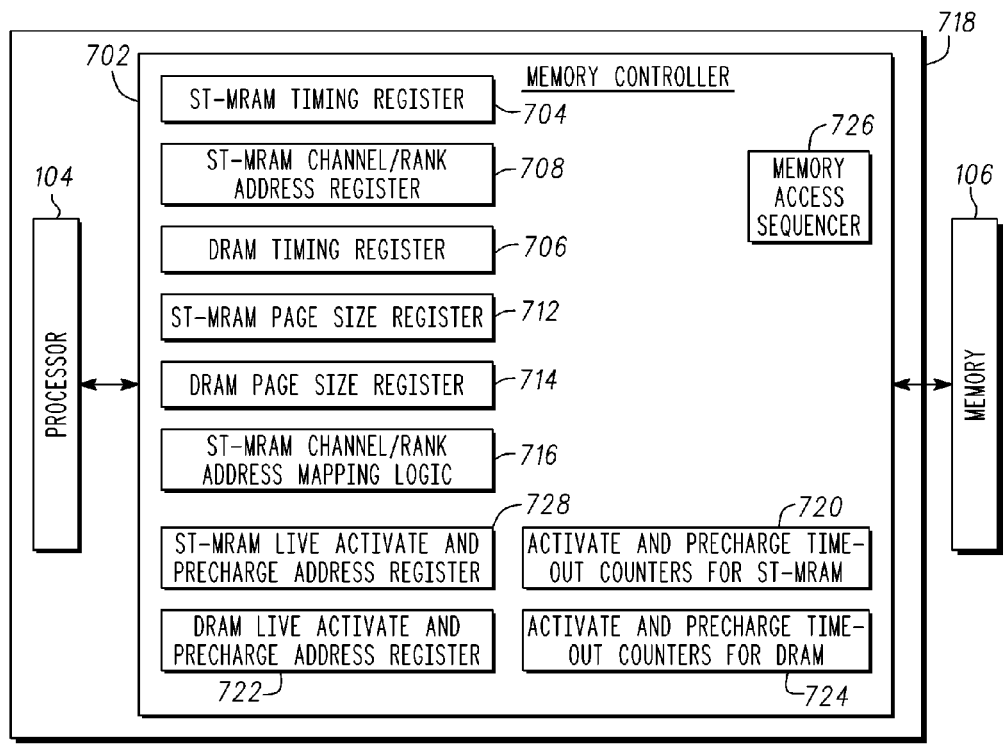
FIG. 7 is a block diagram of a memory controller in accordance with the exemplary embodiments.

FIGS. 2, 3, and 6 are flow charts that illustrate exemplary embodiments of methods 200, 300, 600 suitable for use with a memory controller for interleaving DRAM and MRAM accesses. The various tasks performed in connection with methods 200, 300, 600 may be performed by software, hardware, firmware, or any combination thereof. For illustrative purposes, the following description of methods 200, 300 may refer to elements mentioned above in connection with FIG. 1, and the description of methods 600 may refer to elements mentioned subsequently in connection with FIGS. 4 and 5. In practice, portions of methods 200, 300, 600 may be performed by different elements of the described system, e.g., a processor, a display element, or a data communication component. It should be appreciated that methods 200, 300, 600 may include any number of additional or alternative tasks, the tasks shown in FIGS. 2, 3, 6 need not be performed in the illustrated order, and methods 200, 300, 600 may be incorporated into a more comprehensive procedure or process having additional functionality not described in detail herein. Moreover, one or more of the tasks shown in FIGS. 1, 4, 5 could be omitted from an embodiment of the methods 200, 300, 600 as long as the intended overall functionality remains intact.

Referring to FIG. 2, a flow chart of a first exemplary method 200 of operation for a single ACTIVATE operation, followed by READ/WRITE and PRECHARGE operations of the embodiment of FIG. 1 includes initiating an ACTIVATE operation by issuing 202 the ACTIVATE command, determining 204 if a rank address equals an ST-MRAM address. If no, an ACTIVATE command is issued 206 to the DRAM rank which initiates an ACTIVATE operation in the DRAM rank and a DRAM ACTIVATE latency counter A is reset 208. If the DRAM ACTIVATE latency counter A is not equal to the DRAM ACTIVATE latency 210, the DRAM ACTIVATE latency counter A is incremented 212. If the DRAM ACTIVATE latency counter A is equal to the DRAM ACTIVATE latency 210, DRAM READ/WRITE commands are issued 214 to initiate DRAM READ/WRITE operations, a DRAM PRECHARGE command is issued 216 to initiate DRAM PRECHARGE operation, and a DRAM PRECHARGE latency counter B is reset 218. If the DRAM PRECHARGE latency counter B is not equal to the DRAM PRECHARGE latency 220, the DRAM PRECHARGE latency counter B is incremented 222. If yes, the process 200 is complete.

Referring back to step 204, if the rank address is equal to the ST-MRAM address 204, an ACTIVATE command is issued 224 to the ST-MRAM rank to initiate an ACTIVATE operation in the ST-MRAM rank, and an ST-MRAM ACTIVATE latency counter C is reset 226. If the ST-MRAM ACTIVATE latency counter C does not equal the ST-MRAM ACTIVATE latency 228, the ST-MRAM ACTIVATE latency counter C is incremented 230. If the ST-MRAM ACTIVATE latency counter C does equal the ST-MRAM ACTIVATE latency 228, ST-MRAM READ/WRITE commands are issued 232 to initiate READ/WRITE operations in ST-MRAM, an ST-MRAM PRECHARGE command is issued 234 to initiate PRECHARGE operation in ST-MRAM, and an ST-MRAM PRECHARGE latency counter D is reset 236. If the ST-MRAM PRECHARGE latency counter D does not equal the ST-MRAM PRECHARGE latency 238, the ST-MRAM PRECHARGE latency counter D is incremented 240. If the ST-MRAM PRECHARGE latency counter D does equal the ST-MRAM PRECHARGE latency 238, the process 200 is complete.

Referring to FIG. 3, a flow chart of a second exemplary method 300 of operation for simultaneous issue of ACTIVATE commands for simultaneously initiating ACTIVATE operations, followed by READ/WRITE and PRECHARGE operations to both interleaved DRAM and ST-MRAM of the embodiment of FIG. 1 includes issuing 302 an ACTIVATE command to DRAM and ST-MRAM ranks to initiate ACTIVATE operations in both DRAM and ST-MRAM ranks. DRAM ACTIVATE latency counter A is reset 304 and if the DRAM ACTIVATE latency counter A does not equal the DRAM ACTIVATE latency 306, the DRAM ACTIVATE latency counter A is incremented 308. If the DRAM ACTIVATE latency counter A does equal the DRAM ACTIVATE latency 306, DRAM READ/WRITE commands are issued 310 to initiate DRAM READ/WRITE operations, the DRAM PRECHARGE command is issued 312 to initiate DRAM PRECHARGE operation, and a DRAM PRECHARGE latency counter B is reset 314. If the DRAM PRECHARGE latency counter B does not equal the DRAM PRECHARGE latency 316, the DRAM PRECHARGE latency counter B is incremented 318.

Referring back to step 302, when the ACTIVATE command is issued, a ST-MRAM ACTIVATE latency counter C is reset 320. If the ST-MRAM ACTIVATE latency counter C does not equal the ST-MRAM ACTIVATE latency 322, the ST-MRAM ACTIVATE latency counter C is incremented 324. If the ST-MRAM ACTIVATE latency counter C does equal the ST-MRAM ACTIVATE latency 322, ST-MRAM READ/WRITE commands are issued 326 to initiate ST-MRAM READ/WRITE operations, an ST-MRAM PRECHARGE command is issued 328 to initiate ST-MRAM PRECHARGE operation, and an ST-MRAM PRECHARGE latency counter D is reset 330. If the ST-MRAM PRECHARGE latency counter D does not equal the ST-MRAM PRECHARGE latency 332, the ST-MRAM PRECHARGE latency counter D is incremented 334. When the ST-MRAM PRECHARGE latency counter D equals the ST-MRAM PRECHARGE latency 332, and when the DRAM PRECHARGE latency counter B equals the DRAM PRECHARGE latency 316, the process is complete.

This method of FIG. 3 illustrates simultaneous issue of ACTIVATE commands for simultaneous ACTIVATE operations as an example. ACTIVATE operations may also be initiated one after another. PRECHARGE or AUTO-PRECHARGE commands to both DRAM and ST-MRAM may also be issued simultaneously for simultaneous PRECHARGE operations.

Figure 4:
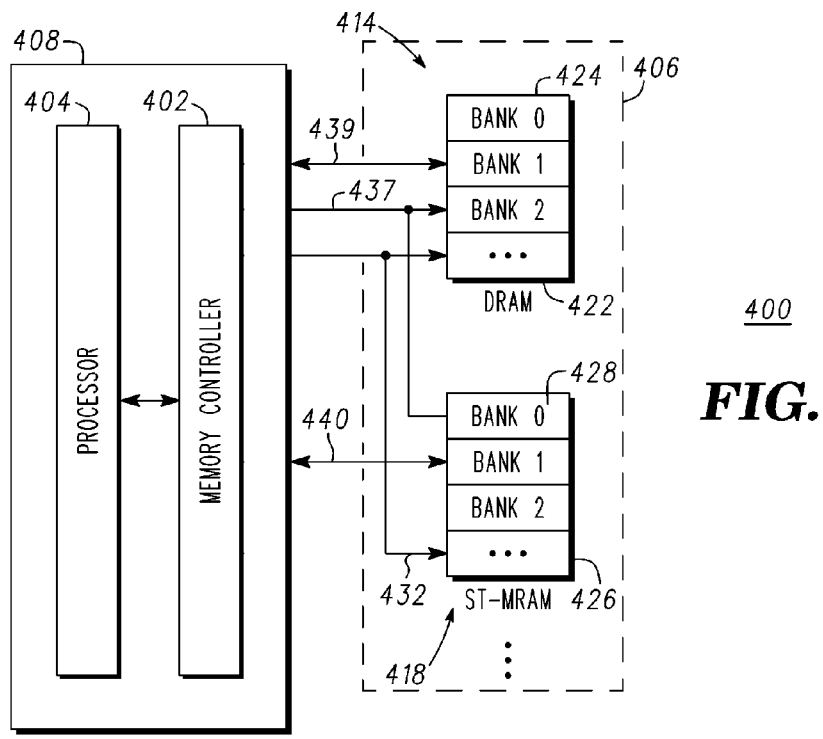
FIG. 4 is a block diagram of a memory controller between a processor and memory in accordance with a second exemplary embodiment.

FIG. 4 is a block diagram of a second exemplary memory system 400 including a memory controller 402 that interleaves data transfer between a processor 404 and the memory 406. The memory controller 402 and the processor 404 may reside on the same chip 408, or they may reside on separate chips (not shown). The memory 406 comprises a plurality of volatile memory elements 414, preferably DRAM, and at least one non-volatile memory element 418 using magnetic tunnel junctions for data storage, preferably ST-MRAM. The volatile memory 414 comprises a plurality of volatile memory elements 422, each including a plurality of volatile memory banks 424. The non-volatile memory comprises at least one non-volatile memory element 426, each including a plurality of non-volatile memory banks 428.

A CS line 432 provides a CS signal from the memory controller 402 to each of the volatile memory elements 422 and each of the non-volatile memory elements 426. An address bus 437 couples the memory controller 402 to each of the volatile memory elements 422 and each of the non-volatile memory elements 426. A first data line 439 couples the memory controller 402 to one of the volatile memory elements 424 and a second data line 440 couples the memory controller 402 to one of the non-volatile memory elements 426. Though only two data lines 439, 440 are shown, it should be understood that one each of a plurality of data lines couple one each of the volatile and non-volatile memory elements 424, 426, respectively.

In operation, a first data bus 439 is connected to the volatile memory 414 while a second portion 440 is connected to the non-volatile memory 418. The address bus 437 is shared with both non-volatile memory 418 and volatile memory 414. A CS line 432 is coupled to the volatile memory 414 and the non-volatile memory 418. An ACTIVATE operation for an address can be initiated in both volatile memory 414 and non-volatile memory 418 simultaneously with CS high. The ACTIVATE operation in the volatile memory 414 would complete earlier than that in non-volatile memory 418. Subsequently, the memory controller 402 initiates READ or WRITE operations in both volatile memory 414 and non-volatile memory 418. The data bus 439 connected to volatile memory 414 will provide correct read data while the data bus 440 connected to non-volatile memory 418 will not provide correct read data as the ACTIVATE operation in non-volatile memory 418 is not yet complete. The memory controller 402 will ignore the portion of the data from non-volatile memory 418 and only use the data bus 439 of volatile memory 414 for valid data. The data from non-volatile memory 418 is read later after the non-volatile memory ACTIVATE operation is complete.

FIG. 5 is a block diagram of a third exemplary memory system 500 including a memory controller 502 that interleaves data transfer between a processor 504 and the memory 506. The memory controller 502 and the processor 504 may reside on the same chip 508, or they may reside on separate chips (not shown). The memory 506 comprises a plurality of volatile memory elements 514, preferably DRAM, and at least one non-volatile memory element 518 using magnetic tunnel junctions for data storage, preferably ST-MRAM. The volatile memory 514 comprises a plurality of volatile memory elements 522, each including a plurality of volatile memory banks 524. The non-volatile memory comprises a plurality of non-volatile memory elements 526, each including a plurality of non-volatile memory banks 528.

A first CS line 532 provides a first CS signal from the memory controller 502 to each of the volatile memory elements 522 and a second CS line 533 provides a second CS signal from the memory controller 502 to each of the non-volatile memory elements 526. An address bus 537 couples the memory controller 502 to each of the volatile memory elements 522 and each of the non-volatile memory elements 526. A first data line 539 couples the memory controller 502 to one of the volatile memory elements 522 and a second data line 540 couples the memory controller 502 to one of the non-volatile memory elements 526. Though only two data buses 539, 540 are shown, it should be understood that one each of a plurality of data buses couple one each of the volatile and non-volatile memory elements 522, 526, respectively.

In operation, a first portion of a data bus 539 is coupled with volatile memory 514 and a second portion of the data bus 540 is coupled to the non-volatile memory 518. The address bus 537 is shared with both non-volatile memory 518 and volatile memory 514. A first CS line 532 is coupled with volatile memory 514 and a second CS line 533 is coupled to the non-volatile memory 518. An ACTIVATE operation for an address can be initiated in both volatile memory 514 and non-volatile memory 518 simultaneously with the CS signal high on both CS lines 532, 533. The ACTIVATE operation in volatile memory 514 would complete earlier than that in non-volatile memory 518. Subsequently, the memory controller 502 initiates READ or WRITE operations in either both volatile memory 514 and non-volatile memory 518 by asserting both CS lines 532 and 533, or only volatile memory 514 by asserting CS line 532. The portion of the data bus connected to volatile memory 514 will provide correct read data while the portion of the data bus connected to non-volatile memory 518 will not provide correct read data as the ACTIVATE operation in non-volatile memory 518 is not yet complete. The memory controller 502 will ignore the portion of the data from non-volatile memory 518 and only use the data bus of volatile memory 514 for valid data. The portion of the data from non-volatile memory 518 is read later after the non-volatile memory 518 ACTIVATE operation is complete. While accessing the portion of the data from non-volatile memory 518, the memory controller 502 initiates READ or WRITE operations in either both volatile memory 514 and non-volatile memory 518 by asserting both CS lines 532 and 533, or only non-volatile memory 518 by asserting CS line 533. The portion of the data bus 540 connected to non-volatile memory 518 will provide correct read data.

Referring to FIG. 6, a flow chart of a second exemplary method 600 of operation for the simultaneous issue of ACTIVATE commands, followed by READ/WRITE, and PRECHARGE commands to both interleaved DRAM and ST-MRAM of the embodiments of FIGS. 4 and 5 includes issuing 602 an ACTIVATE command to both DRAM and ST-MRAM channels to initiate ACTIVATE operations in both DRAM and ST-MRAM. In response thereto, in step 604 an ST-MRAM ACTIVATE latency counter C is reset and a ST-MRAM_ACTIVATED flag is set to NO. If the ST-MRAM ACTIVATE latency counter C is not equal to the ST-MRAM ACTIVATE latency 606, the ST-MRAM ACTIVATE latency counter C is incremented 608. If the ST-MRAM ACTIVATE latency counter C is equal to the ST-MRAM ACTIVATE latency 606, the ST-MRAM_ACTIVATED flag is set to YES 610.

A DRAM ACTIVATE latency counter A is reset 612, and if not equal to 614 the DRAM ACTIVATE latency, is incremented 616. If the DRAM ACTIVATE latency counter A is equal to the DRAM ACTIVATE latency 614, a READ/WRITE command is issued 617 to initiate READ/WRITE operation. If the ST-MRAM_ACTIVATED flag is not YES 618, a data bus portion of the DRAM is set as valid 620 in response to recently issued READ/WRITE command 617, and step 617 is repeated. If in step 618, the ST-MRAM_ACTIVATED flag is YES, data bus portions of both DRAM and ST-MRAM are set as valid 622 in response to recently issued READ/WRITE command 617. If there are more READ/WRITE commands pending 624 for the ACTIVATE command 602, step 617 is repeated, but if NO, a PRECHARGE command is issued 626 to simultaneously initiate PRECHARGE operations in DRAM and ST-MRAM and steps 628 and 634 are initiated. In step 628, a DRAM PRECHARGE latency counter B is reset, and if the DRAM PRECHARGE latency counter B does not equal the DRAM PRECHARGE latency, the DRAM PRECHARGE latency counter B is incremented 632. If the DRAM PRECHARGE latency counter B equals the DRAM PRECHARGE latency 630. In step 634, an ST-MRAM PRECHARGE latency counter D is reset, and if not equal to the ST-MRAM PRECHARGE latency, is incremented 638. When the ST-MRAM PRECHARGE latency counter D equals the ST-MRAM PRECHARGE latency 636, and when the DRAM PRECHARGE latency counter B equals the DRAM PRECHARGE latency 630, the process is complete.

A memory controller 702 of the memory system 700, which is coupled between the processor 104 and memory 106, includes a programmable register ST-MRAM Timing Register 704 to separately program ACTIVATE and PRECHARGE latencies for ST-MRAM. DRAM timing latencies are programmed in a DRAM Timing Register 706. The memory controller 702 further includes an ST-MRAM Channel/Rank Addr Register 708 to program which Rank or Channel address ST-MRAM is connected. The memory controller further includes programmable register ST-MRAM Page Size Register 712 to separately program the page size for ST-MRAM from that of DRAM. DRAM page size is programmed in DRAM Page Size Register 714. The aforementioned registers can be programmed during runtime through software or can be loaded from another non-volatile memory source or fuse during system boot time.

The memory controller 702 also includes an ST-MRAM Channel/Rank Address Mapping Logic 716 that decodes the Rank or Channel address in any incoming memory access commands from the host chip 718 to identify if the access is to ST-MRAM. When the DDR3 memory controller 702 receives a memory access command from the host chip 718 it compares the rank address portion of the memory address with the non-volatile memory programmable ST-MRAM Channel/Rank Addr Register 708 in the case of rank interleaving illustrated in FIG. 1. If the rank address indicates non-volatile memory access, the memory controller 702 retrieves ACTIVATE, PRECHARGE latencies, and page size from the programmable ST-MRAM Timing Register 704 and ST-MRAM Page Size Register 712. In the case of Channel Interleaving illustrated in FIGS. 4 and 5, when the DDR3 memory controller 702 receives a memory access command from the host chip 718, it compares the channel address portion of the memory address with the non-volatile memory programmable ST-MRAM Channel/Rank Addr Register 708. If the channel address indicates non-volatile memory access, the memory controller 702 retrieves ACTIVATE, PRECHARGE latencies, and page size from the programmable ST-MRAM Timing Register 704 and ST-MRAM Page Size Register 712.

The hardware implementation of the memory controller 702 would also contain ST-MRAM Live ACTIVATE and PRECHARGE address register 728 coupled to ACTIVATE and PRECHARGE time-out counters for ST-MRAM 720 for non-volatile memory than volatile memory to indicate when corresponding non-volatile memory ACTIVATE and PRECHARGE are complete. A separate DRAM Live ACTIVATE and PRECHARGE address register 722 coupled to the ACTIVATE and PRECHARGE time-out counters for DRAM 724 for volatile memory indicates when corresponding volatile memory ACTIVATE and PRECHARGE are complete. Thus different latencies for non-volatile and volatile memories are managed separately to increase bandwidth of the memory system.

The hardware implementation of the memory controller 702 further contains a Memory Access Sequencer 726 that queues memory access commands from the host chip 718 and issues volatile and non-volatile memory commands to initiate volatile and non-volatile memory operations for increased bandwidth. Memory commands and associated operations can be categorized into DRAM (volatile) and ST-MRAM (non-volatile) memory accesses due to their unique rank or channel address. The Memory Access Sequencer 726 implements methods of operation for the memory controller that include the following operation queuing and initiating algorithms: (a) ST-MRAM ACTI- VATE operations can be initiated earlier than DRAM ACTIVATE operations from a queue of ACTIVATE operations. (b) An ST-MRAM ACTIVATE busy flag (provided by the time-out counter) in the Controller queues ST-MRAM read/write operations, while DRAM memory access operations can be initiated. (c) More READ/WRITE operations to the ST-MRAM are queued up prior to initiating a PRECHARGE operation in the ST-MRAM to close an open row. Due to longer ACTIVATE and PRECHARGE operation latencies in ST-MRAM, the queuing algorithm waits and queues a higher (than that of DRAM) number of READ/WRITE operations to ensure there is no pending READ/WRITE operation in an already open ST-MRAM row prior to closing the open row; therefore, ST-MRAM PRECHARGE operation is less frequent than DRAM PRECHARGE operation. (d) In a sequence of ST-MRAM and DRAM PRECHARGE operations, the ST-MRAM PRECHARGE operation can be initiated earlier to hide the longer latency; (e) when full page accesses are requested from ST-MRAM and DRAM, ST-MRAM memory READ/WRITE operation for an open page is performed different number of times due to page size difference from DRAM.

The hardware implementation for the Memory Access Sequencer 726, ST-MRAM Live ACTIVATE and PRECHARGE Address Register 728, ACTIVATE and PRECHARGE time-out counters for ST-MRAM 720, DRAM Live ACTIVATE and PRECHARGE Address Register 722, and ACTIVATE and PRECHARGE time-out counters for DRAM 724 can be done using Finite State Machines and logic circuits. The memory controller 702 may contain other blocks.

The processor 104 may be implemented or realized with a general purpose processor, a content addressable memory, a digital signal processor, an application specific integrated circuit, a field programmable gate array, any suitable programmable logic device, discrete gate or transistor logic, discrete hardware components, or any combination designed to perform the functions described herein. A processor device may be realized as a microprocessor, a controller, a microcontroller, or a state machine. Moreover, a processor device may be implemented as a combination of computing devices, e.g., a combination of a digital signal processor and a microprocessor, a plurality of microprocessors, one or more microprocessors in conjunction with a digital signal processor core, or any other such configuration.

Although the described exemplary embodiments disclosed herein are directed to various memory structures, the present invention is not necessarily limited to the exemplary embodiments which illustrate inventive aspects of the present invention that are applicable to a wide variety of semiconductor devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A memory system comprising:
    a volatile memory that includes a volatile memory array, wherein during an activate operation to the volatile memory, the volatile memory is configured to read a page of volatile data from the volatile memory array and store the page of volatile data in data-store latches of the volatile memory;
    a non-volatile memory that includes a non-volatile memory array, wherein during an activate operation to the non-volatile memory, the non-volatile memory is configured to read a page of non-volatile data from the non-volatile memory array and store the page of non-volatile data in data-store latches of the non-volatile memory, wherein an activate latency of the non-volatile memory is longer than an activate latency of the volatile memory;
    a shared data bus coupled to the volatile memory and the non-volatile memory;
    a shared address bus coupled to the volatile memory and the non-volatile memory; and
    a memory controller coupled to the shared data bus and the shared address bus, wherein the memory controller includes a queue that queues memory commands received by the memory controller, wherein the memory controller is configured to categorize the memory commands into volatile and non-volatile memory accesses based on an address received with each memory command, and wherein the memory controller is configured to:
        initiate activate operations in the volatile memory and the non-volatile memory, including sending an address for the activate operations from the memory controller over the shared address bus to both the volatile memory and the non-volatile memory; and
        initiate read operations for the volatile memory and the non-volatile memory, wherein the memory controller is configured to receive data for the read operations for the volatile memory and the non-volatile memory over the shared data bus.

2. The memory system of claim 1, wherein the memory controller queues a higher number of non-volatile memory read/write operations than a number of volatile memory read/write operations.

3. The memory system of claim 1, wherein the volatile memory is dynamic random access memory (DRAM) and the non-volatile memory is spin-torque magnetic random access memory (ST-MRAM), and wherein the memory controller categorizes the memory commands into DRAM memory accesses and ST-MRAM memory accesses based on the address received with each memory command.

4. The memory system of claim 3, wherein the DRAM is DDR3 DRAM and the ST-MRAM is DDR3 ST-MRAM such that both the volatile memory and the non-volatile memory are configured to receive DDR3 activate commands and DDR3 precharge commands.

5. The memory system of claim 3, wherein the memory controller queues a higher number of ST-MRAM read/write operations than a number of DRAM read/write operations.

6. The memory system of claim 1 further comprising:
a first chip select signal coupled to the volatile memory and the memory controller, wherein initiating an activate operation or a read operation in the volatile memory includes asserting the first chip select signal; and
a second chip select signal coupled to the non-volatile memory and the memory controller, wherein initiating an activate operation or a read operation in the non-volatile memory includes asserting the second chip select signal.

7. The memory system of claim 1 wherein the memory controller further comprises:
a first register that stores the activate latency of the volatile memory; and
a second register that stores the activate latency of the non-volatile memory.

8. The memory system of claim 7, wherein the first and second registers are programmable registers.

9. The memory system of claim 1, wherein the memory controller further comprises:
a register that stores precharge latency for the volatile memory; and
a register that stores precharge latency for the non-volatile memory.

10. The memory system of claim 1, wherein the memory controller further comprises a register that stores a page size for the non-volatile memory.

11. A memory system comprising:
a volatile memory that includes a volatile memory array, wherein during an activate operation to the volatile memory, the volatile memory is configured to read a page of volatile data from the volatile memory array and store the page of volatile data in data-store latches of the volatile memory;
a non-volatile memory that includes a non-volatile memory array, wherein during an activate operation to the non-volatile memory, the non-volatile memory is configured to read a page of non-volatile data from the non-volatile memory array and store the page of non-volatile data in data-store latches of the non-volatile memory, wherein an activate latency of the non-volatile memory is longer than an activate latency of the volatile memory;
a first data bus coupled to the volatile memory;
a second data bus coupled to the non-volatile memory;
a shared address bus coupled to the volatile memory and the non-volatile memory; and
a memory controller coupled to the first data bus, the second data bus, and the shared address bus, wherein the memory controller includes a queue that queues memory commands received by the memory controller, wherein the memory controller is configured to categorize the memory commands into volatile and non-volatile memory accesses based on an address received with each memory command, and wherein the memory controller is configured to:
initiate activate operations in the volatile memory and the non-volatile memory, including sending an address for each activate operation from the memory controller over the shared address bus to both the volatile memory and the non-volatile memory; and
initiate read operations for the volatile memory and the non-volatile memory, wherein, for a first read operation, the memory controller is configured to:
send an address for the first read operation over the shared address bus to both the volatile memory and the non-volatile memory;
when the first read operation is categorized as a volatile memory access, receive data for the first read operation over the first data bus; and
when the first read operation is categorized as a non-volatile memory access, receive the data for the first read operation over the second data bus.

12. The memory system of claim 11 further comprising:
a first chip select signal coupled to the volatile memory and the memory controller, wherein initiating an activate operation or a read operation in the volatile memory includes asserting the first chip select signal; and
a second chip select signal coupled to the non-volatile memory and the memory controller, wherein initiating an activate operation or a read operation in the non-volatile memory includes asserting the second chip select signal.

13. The memory system of claim 11 wherein the memory controller further comprises:
a first register that stores the activate latency of the volatile memory; and
a second register that stores the activate latency of the non-volatile memory.

14. The memory system of claim 11 further comprising a shared chip select signal coupled to the volatile memory, the non-volatile memory, and the memory controller, and wherein the memory controller is further configured to:
initiate activate operations for a first address simultaneously in the volatile memory and the non-volatile memory, wherein initiating the activate operations for the first address includes the memory controller asserting the shared chip select signal and sending the first address over the shared address bus to both the volatile memory and the non-volatile memory; and
after the activate operation for the first address in the volatile memory is complete and before the activate operation for the first address in the non-volatile memory is complete, initiate a read operation in both the volatile memory and the non-volatile memory, wherein initiating the read operation includes the memory controller asserting the shared chip select signal.

15. The memory system of claim 11, wherein the memory controller queues a higher number of non-volatile memory read/write operations than a number of volatile read/write operations.

16. The memory system of claim 11, wherein the volatile memory is dynamic random access memory (DRAM) and the non-volatile memory is spin-torque magnetic random access memory (ST-MRAM), and wherein the memory controller categorizes the memory commands into DRAM memory accesses and ST-MRAM memory accesses based on the address received with each memory command.

17. A memory controller comprising:
- a first register configured to store activate latency for a volatile memory;
- a second register configured to store activate latency for a non-volatile memory, wherein the activate latency for the non-volatile memory is longer than the activate latency for the volatile memory;
- a queue for queuing memory commands, wherein the memory commands are categorized into volatile memory accesses and nonvolatile memory accesses based on an address received with each memory command;
- a memory access sequencer coupled to the first register and the second register, wherein the memory access sequencer is configured to:
    - initiate activate operations the volatile memory and the non-volatile memory, wherein initiating an activate operation includes:
        - outputting a first address to the volatile memory and the non-volatile memory over a shared address bus;
        - asserting at least one of a first chip select signal corresponding to the volatile memory and a second chip select signal corresponding to the non-volatile memory; and
    - initiate read operations in the volatile memory and the non-volatile memory, wherein initiating a read operation includes:
        - outputting a second address to the volatile memory and the non-volatile memory over the shared address bus; and
        - asserting at least one of the first chip select signal and the second chip select signal.

18. The memory controller of claim 17 further comprising:
- a third register that stores precharge latency for the non-volatile memory; and
- a fourth register that stores precharge latency for the volatile memory.

19. The memory system of claim 17, wherein the memory controller queues a higher number of non-volatile memory read/write operations than a number of volatile read/write operations.

20. The memory system of claim 17, wherein the memory controller further comprises a register that stores a page size for the non-volatile memory.

* * * * *